Jan. 31, 1967 K. SCHMID 3,302,121

REACTANCE AMPLIFIER INCLUDING PHASE MODULATION AND DEMODULATION

Filed May 14, 1963 4 Sheets-Sheet 1

INVENTOR

Konrad Schmid

BY Lowry & Rinehart

ATTORNEYS

INVENTOR
Konrad Schmid
BY Lowry & Rinehart
ATTORNEYS

Jan. 31, 1967 K. SCHMID 3,302,121

REACTANCE AMPLIFIER INCLUDING PHASE MODULATION AND DEMODULATION

Filed May 14, 1963 4 Sheets-Sheet 3

INVENTOR
Konrad Schmid
BY Lowry & Rinehart
ATTORNEYS

INVENTOR
Konrad Schmid
BY Lowry & Rinehart
ATTORNEYS

United States Patent Office 3,302,121
Patented Jan. 31, 1967

3,302,121
REACTANCE AMPLIFIER INCLUDING PHASE MODULATION AND DEMODULATION

Konrad Schmid, Frantorpsgatan 144, Goteborg, Sweden
Filed May 14, 1963, Ser. No. 280,286
3 Claims. (Cl. 330—7)

This invention relates to a method and device for amplifying signals from D.-C. to video frequencies, which term is meant to include signal frequencies of several megacycles and refers more particularly to a method and device of reactance amplification of small signal currents.

One primary object of this invention is to provide a method of amplification which has low noise properties surpassing those of conventional vacuum tubes and transistors.

Another objective of this invention is to provide an amplifying device which has low noise properties at high signal source impedances of several megohms.

Another objective of this invention is to provide an amplifying device which has lower input capacitance than conventional vacuum tubes and transistors.

Still another objective of this invention is to provide a device for amplification which includes only semiconductor diodes and, because of the nature of semiconductors, should thereby have an unlimited life.

These and other inventive objects of the present invention will become apparent in the course of the following specification.

The parametric amplifier utilizes the properties of nonlinear or time-varying reactances. Since the reactance is capable of storing electromagnetic energy, the parametric amplifier is supplied with energy from an A.-C. source or so-called pump source and differs in this respect from the vacuum tube and transistor amplifiers which are supplied with D.-C. power. The pump frequency is usually much larger than the signal frequency. The function of the time-varying reactance is to channel energy from the pump source to a useful load. Since the time-varying reactance constitutes the real heart of the parametric amplifier, this type of amplifier is also called reactance amplifier.

Semiconductor diodes are most frequently employed as variable reactances. A p-n junction diode has a nonlinear voltage-capacitance characteristic. A narrow region at the junction is practically free of carriers and is known as the depletion layer. If a voltage is applied at the junction, the electron- hole-distribution will be changed, which in turn varies the width of the depletion layer and consequently the capacitance of the junction. A p-n junction diode can therefore be made to behave as a variable reactance. The name "varactor" has become associated with a type of low loss semiconductor diode specially designed for applications such as parametric amplification.

The variation in capacitance results from very minute motions of electrons and holes. Since no actual flow of charge carriers through the junction is involved, the shot-noise associated with a current flow is virtually eliminated. In the case of an ideal lossless reactance, the noise contribution of the amplifier is only due to thermal noise generated by network losses. The most outstanding feature of parametric amplifiers is therefore their low noise characteristic.

The objectives of this invention were obtained by a novel type of reactance amplifier comprising only one parallel resonant circuit in which pump power supplied from an external source through a series impedance is stored in said resonant circuit and is phase-modulated by the signal to be amplified. At least one variable capacitance diode forms a bridge with the divided inductance of the resonant circuit. One feature of this invention is that a phase-sensitive detector with a single-ended output is directly connected to the parallel resonant circuit which contains the phase-modulated pump energy.

The purpose of this invention is to provide a simple method of reactance amplification of signals ranging from D.-C. to video frequencies in all these cases in which the use of a reactance amplifier is justified. This will become apparent in the course of the following considerations:

The noise figure of an amplifier is a function of the signal source impedance. For the range of signal frequencies considered here, the noise figure of conventional vacuum tube and transistor amplifiers is sufficiently low, provided that a signal source with a suitable source impedance is available. In a conventional vacuum tube amplifier, a minimum noise figure is obtained for a range of source impedances from 1 kΩ to approx. 100 kΩ. This invention, however, is characterized by the fact, that best noise performance is obtained for a source impedance of 1 MΩ to several MΩ. An obvious application of this invention is therefore the amplification of signals generated by high impedance sources, i.e. amplification of signal currents. Conventional amplifiers employing vacuum tubes or transistors exhibit a relatively high input capacitance. In the case of a wideband amplifier connected to a high impedance source, this capacitance substantially reduces the bandwidth of the input circuit. In a typical example such as the vidicon amplifier, considerable frequency compensation is required in the following amplifier stages. Since the maximum amount of available compensation is determined by stability considerations, the input capacitance has therefore an important bearing on the practical choice of the signal source impedance and hence on the available signal to noise ratio.

This invention provides the possibility of effectively reducing the input capacitance by selection of proper variable capacitance diodes and by choosing a suitable operating point.

This invention will be better understood when taken in connection with the accompanying drawings.

Figure 1:
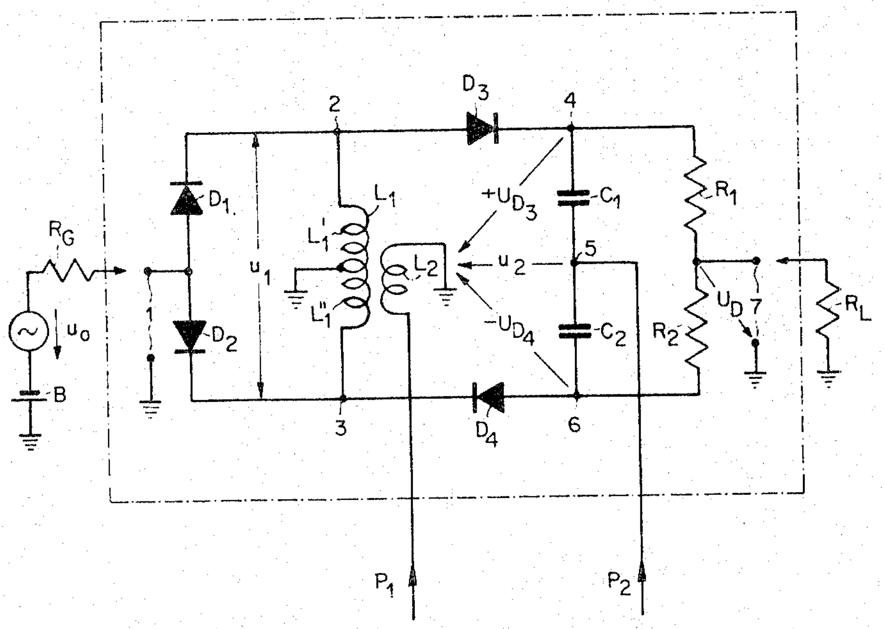
FIG. 1 represents a schematic circuit diagram illustrating the operating principles of the invention.

Reference will now be made to FIG. 1 which illustrates the operating principles of this invention. Pump power $P_1$ generated by an external pump source is supplied to a parallel resonant circuit comprising the inductance $L_1$ and two variable capacitance diodes $D_1$ and $D_2$. The parallel resonant circuit is tuned to the pump frequency $f_p$ and is therefore also called pump circuit. The pump circuit is excited by a constant pump current which requires a high pump source impedance. A constant pump current, however, can easily be obtained by means of a series impedance. The diode junctions are resonating with the external circuit elements, the resonant current being large compared with the supplied pump current. At resonance the pump voltage $u_1$ across the pump circuit is in phase with the pump current. The signal to be amplified is applied to the input 1 of the reactance amplifier. It causes the average junction capacitance of the pumped diodes to vary with time. The variable capacitance diodes plus the signal can therefore be replaced by a time-varying capacitance at signal frequency. The capacitance variation causes the pump voltage across the parallel resonant circuit to vary its amplitude and phase. The pump energy is therefore amplitude- and phase-modulated at signal frequency. This invention makes use of the phase modulation of the pump. Phase-modulated pump energy is consequently fed to a phase-sensitive detector.

Conventionally, the first step in phase detection is to add a quadrature component to the phase-modulated signal, which tends to convert the original phase modulation into a proportional amplitude modulation. In this invention, the phase-to-amplitude conversion is obtained by adding a quadrature pump signal at 5. Two detector diodes $D_3$ and $D_4$ connected to the parallel resonant circuit in opposite polarity add the phase modulated pump energy $P'_2$ and the pump energy $P'_2$ supplied through capacitors $C_1$ and $C_2$. The sum and difference of half the pump voltage $u_1$ appearing across the pump circuit and the pump voltage $u_2$ at 4 and 6 are rectified separately. The same rectified current flows through both diodes and the load resistors $R_1$ and $R_2$ since the D.-C. paths are in series. The rectified voltages $+U_{D3}$ and $-U_{D4}$ at 4 and 6 respectively are combined in reversed polarity. A phase shift of the pump voltage $u_1$ alter the magnitude of the votages applied to the detector diodes $D_3$ and $D_4$. This causes a change of the rectified voltages $+U_{D3}$ and $-U_{D4}$ and hence of the output voltage $U_D$. The output voltage which appears across the load $R_L$ is therefore dependent on the relative phase of the pump voltage $u_1$ with respect to the pump voltage $u_2$.

Figure 2:
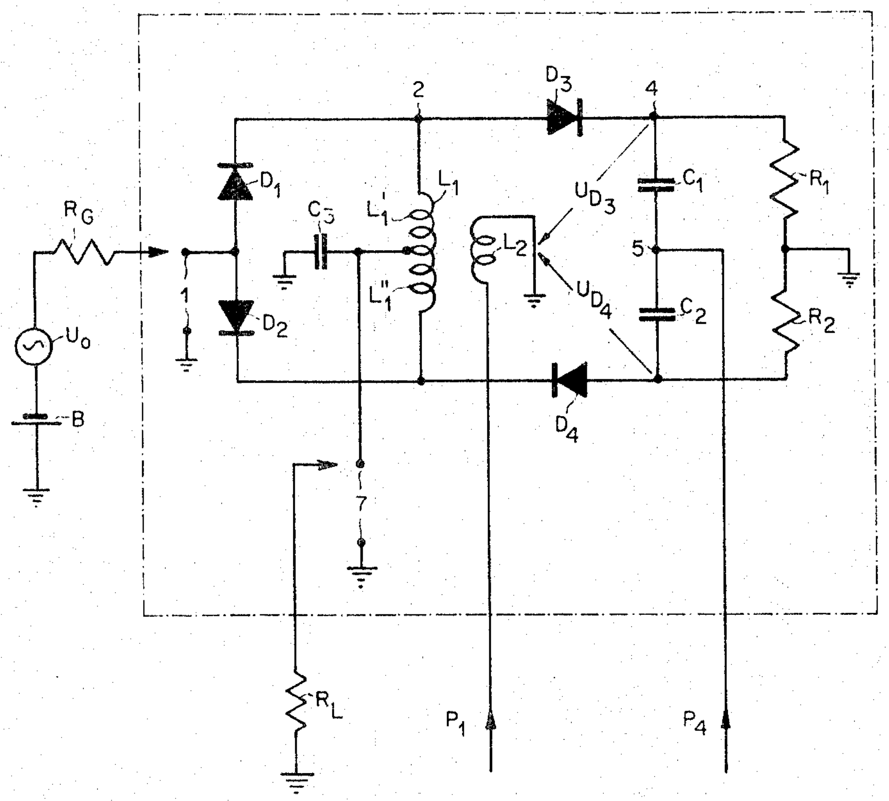
FIG. 2 represents a schematic circuit diagram illustrating the operating principles of an alternate form of this invention in which feedback of the output voltage into the input circuit is employed.

In an alternative form of this invention (FIG. 2) the resistors $R_1$ and $R_2$, rather than the tap 8 of the inductance $L_1$, are connected to ground. The output signal then appears at the tap of the inductance. The capacitance $C_3$ represents a low impedance at the pump frequency. At the highest signal frequency, however, its impedance value is still greater than the resistance of the load $R_L$. The polarity of each diode pair $D_1$, $D_2$, and $D_3$, $D_4$ respectively is chosen such that the output voltage at 7 is in phase with the input voltage at 1. The total output voltage is fed back into the input circuit and is in series with the input voltage. The feedback-type amplifier as shown in FIG. 2 can be considered as a reactance equivalent to the conventional cathode-follower amplifier. It has all essential features in common with a cathode-follower amplifier:

(1) High input impedance.
(2) Low output impedance.
(3) Voltage gain of less than 1.
(4) Output voltage is in phase with input voltage.

Since this invention provides amplification of D.-C. signals as well as A.-C. signals, the practically important advantage of an automatic frequency control is obtained with the feedback-type amplifier (FIG. 2).

This object of the present invention becomes apparent in the course of the following description. It is assumed, that the junction capacitance of the diodes $D_1$ and $D_2$ has been changed as a result of a temperature change. The total change in capacitance $\Delta C$, which is reflected into the pump circuit, tends to shift the resonant frequency of the pump circuit $\Delta f$. In order to stabilize the gain, it is possible to shift the pump frequency by the same amount $\Delta f$. If the pump frequency is fixed, however, it is desirable to apply some sort of frequency control to the pump circuit. A control voltage is generally required in order to accomplish frequency control. In this invention the control voltage is available as the D.-C. component of the output signal. In the alternative form of this invention (FIG. 2) "built-in" automatic frequency control is achieved, i.e. no external A-F-C loop is required.

Figure 3:
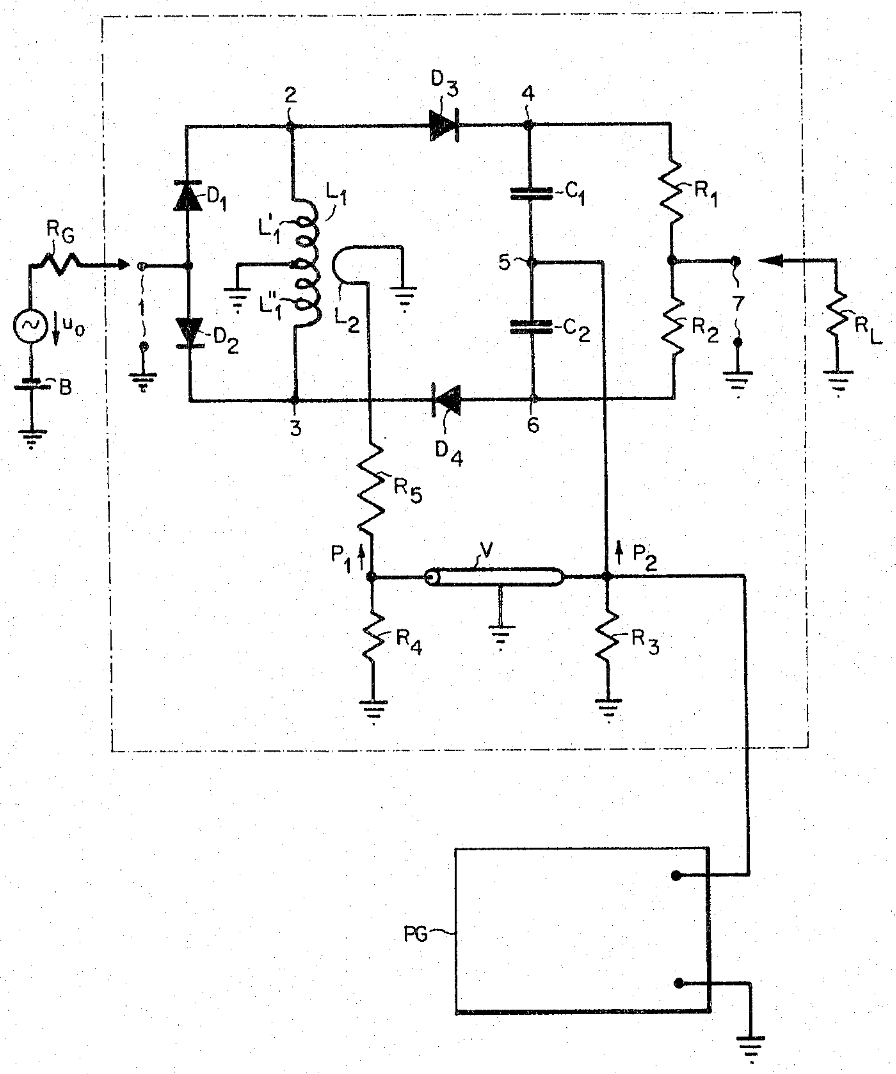
FIG. 3 represents a schematic circuit diagram of a video amplifier based upon this invention.

Reference will now be made to FIG. 3 which allows a more detailed description of a reactance video-amplifier.

Another objective of this invention is to prevent radiation of pump power through the input circuit. This is particularly important for pump frequencies in those frequency bands which are allocated for radio and TV broadcasting and for communications in general. This objective is attained by employing a bridge circuit built by the variable capacitance diode $D_1$ and $D_2$ and the inductance $L_1$. The ratios of the partial inductances $L'_1$, $L''_1$ and the diode junction capacitances $C_{D1}$, $C_{D2}$ have to fulfill the following relation:

$$\frac{L'_1}{L''_1}=\frac{C_{D2}}{C_{D1}}$$

Assuming that the bridge is balanced, no pump voltage will appear at the input 1. It is for various reasons, desirable to use diodes with equal junction capacitance, which requires a center-tap on the inductance $L_1$. The center-tap is grounded and establishes thereby a D.-C. return for the detector diodes. Another D.-C. return for the variable capacitance diodes is provided externally through the generator impedance and the D.-C. bias source.

Figure 4:
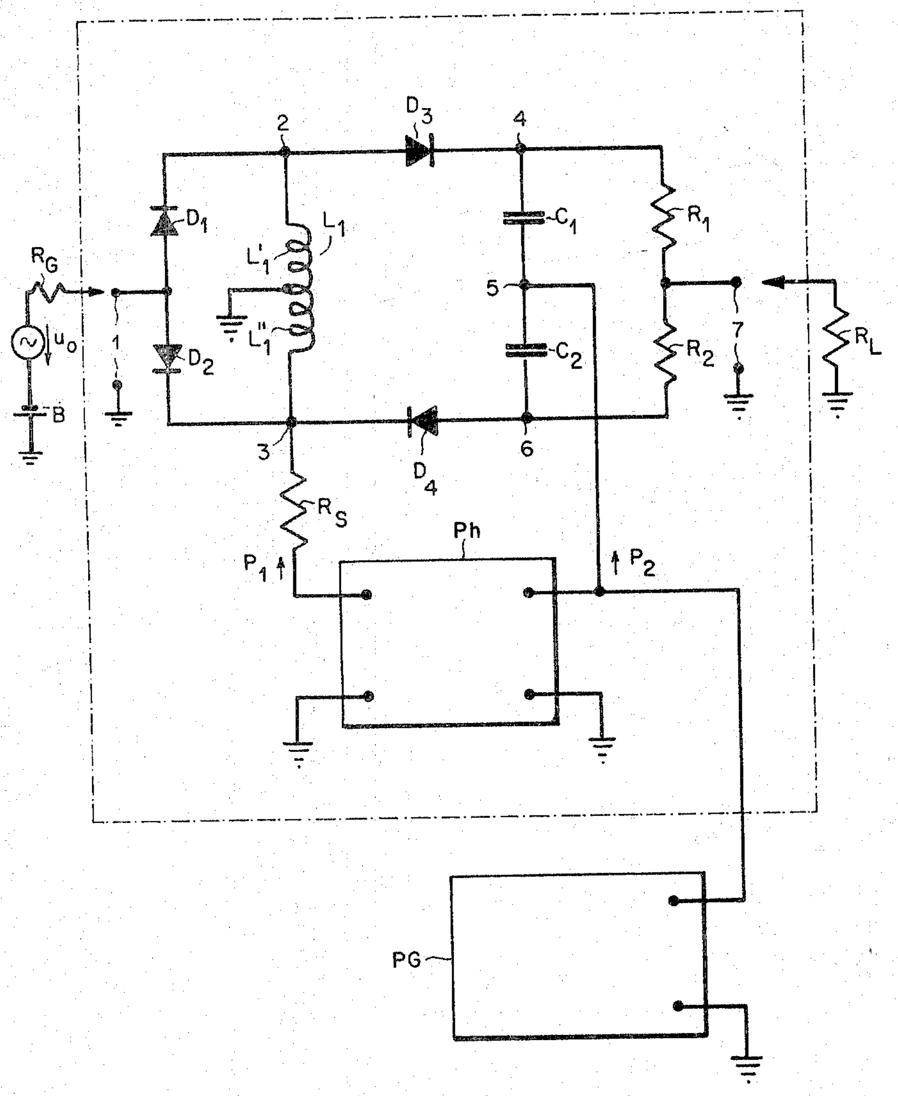
FIG. 4 represents a schematic circuit diagram of a low-frequency amplifier based upon this invention.

A reactance video amplifier may require a pump frequency of several hundred megacycles. At these pump frequencies, good balance of the modulator bridge can be obtained by coupling the pump generator PG inductively through $L_2$ to the pump circuit. For a reactance low-frequency amplifier, a pump frequency in the order of 1 mc. is sufficient. In this case, the inductance $L_2$ may be bifilar wound, which allows asymmetric coupling of the pump generator PG to the pump circuit through a series resistance (FIG. 4).

The phase difference between the pump voltages $u_1$ and $u_2$ respectively can be attained by various means. For a pump frequency in the VHF range (30 to 300 mc.) or in the UHF range (300 to 3000 mc.) the use of a delay line V of a quarter wavelength represents an economical solution. For low frequency amplifiers operating with relatively low pump frequencies, such delay lines would be of considerable length. In those applications, a phase-shift network employing concentrated elements seems to be more suitable.

A reactance video-amplifier as shown in FIG. 3 was developed using the following components:

| | |
|---|---|
| Varactor diodes $D_1$, $D_2$ | Microwave associates MA 4321–B (junction capacitance at 0 v.: 2.0 pf.). |
| Inductance $L_1$ | 0.2 $\mu$h., 8 turns, 1 mm. silvered wire on coil form type Vogt 5/25.5–609. |
| Inductance $L_2$ | ¾ turn, 1.5 mm. wire. |
| Detector-diodes $D_3$, $D_4$ | Hughes HD 5001. |
| Resistors $R_1$, $R_2$ | 4.7 kΩ. |
| Resistors $R_3$, $R_4$ | 50Ω. |
| Resistor $R_5$ | 470Ω. |
| Resistor $R_L$ | 3.9 kΩ. |
| Delay line V | Amphenol Type RG 174/U, length: 18 cm. |

The reactance video-amplifier operates at a pump frequency of 270 mc. The performance data given below refer to a pump voltage of 500 mv. (measured on $R_3$) and a diode reverse bias of 450 mv.:

| | | |
|---|---|---|
| Max. available power gain | db | 38.5 |
| Voltage gain (for $R_L$=3.9 kΩ) | | 1.2 |
| Bandwidth (measured with constant input voltage) | mc | 5 |
| Input impedance | MΩ | 20 |
| Input capacitance | pf | 5.2 |
| Output impedance | kΩ | 4 |
| Noise figure (for $R_G$=1 MΩ and a noise bandwidth of 200 kc.) | db | 0.5 |

While the invention has been described in detail with respect to a now preferred example and embodiment of the invention it will be understood by those skilled in the art after understanding the invention, that various changes and modifications may be made without departing from the spirit and scope of the invention and it is intended, therefore, to cover all such changes and modifications in the appended claims.

What I claim as new and desire to secure by Letters Patent, is:

1. A reactance amplifier comprising (a) a single parallel resonant circuit comprising a bridge having first, second, third and fourth arms; a center-tapped first inductor comprising said first and said conductor; a first polarized capacitor compris- second arms; means for grounding the center tap of ing said third arm, and a second polarized capacitor comprising said fourth arm; said capacitors having similar terminals connected together;

(b) means for applying an input signal to the junction of said first and second capacitors and to said ground connection so that an input signal is applied equally to each of said first and second capacitors;

(c) a second inductor means coupled to said first inductor means, first means for applying pump power to said second inductor means to induce pump power in said first and second arms in phase opposition;

(d) the values of said first and second capacitors and said first inductor being chosen so that with no input signal said bridge is balanced and no pump power flows through the junction of said first and second capacitors into said signal source and said single resonant circuit is tuned to the frequency of said pump power;

(e) a phase detector connected across said first inductor, said phase detector comprising a first rectifier having one end connected to one end of said first inductor, a second rectifier having one end connected to the other end of said first inductor, said one end of said first and second rectifiers being of opposite polarities, a first branch circuit comprising third and fourth capacitors, connected in series between the other ends of said first and second rectifiers, and a second branch circuit comprising first and second resistors connected in series to the other ends of said first and second rectifiers;

(f) and second means for applying pump power to the junction of said second and third capacitors, the pump power applied by said second means having a quadrature phase relation with the pump power applied by said first means.

2. The reactance amplifier defined in claim 1 wherein said first and second polarized capacitors comprise voltage sensitive diodes having a capacitance which varies with the potential applied to them, the application of an input potential serving to affect the first and second capacitors substantially the same amounts whereby said single tuned circuit is untuned at the frequency of said pump power.

3. The reactance amplifier defined in claim 2 further including means for connecting an output load between the junction of said first and second resistors and said ground connection.

References Cited by the Examiner

UNITED STATES PATENTS

| | | | |
|---|---|---|---|
| 3,101,452 | 8/1963 | Holcomb et al. | 330—4.9 |
| 3,121,844 | 2/1964 | Glomb | 330—4.5 |
| 3,196,360 | 7/1965 | Boyden | 330—10 |

OTHER REFERENCES

Jenkins: "Electrical Manufacturing," December 1954, pp. 83–88.

Biard: Proc. IEEE, February 1963, pp. 298–303.

NATHAN KAUFMAN, *Primary Examiner.*

D. HOSTETTER, *Assistant Examiner.*